United States Patent [19]

Moriyama et al.

[11] Patent Number: 4,914,054

[45] Date of Patent: Apr. 3, 1990

[54] METHOD OF PRODUCING A SEMICONDUCTOR DEVICE PROVIDED WITH FRONT AND BACK SURFACE ELECTRODES

[75] Inventors: Shigeru Moriyama, Himeji; Kinzo Tao, Hyogo; Yoshio Yamamoto, Yokohama, all of Japan

[73] Assignee: Kabushiki Kaisha Toshiba, Kawasaki, Japan

[21] Appl. No.: 925,490

[22] Filed: Oct. 29, 1986

Related U.S. Application Data

[62] Division of Ser. No. 610,703, May 16, 1984, abandoned.

[30] Foreign Application Priority Data

May 18, 1983 [JP] Japan .................................. 58-87033

[51] Int. Cl.$^4$ ................... H01L 21/285; H01L 21/304
[52] U.S. Cl. .................................... 437/183; 437/159; 437/196
[58] Field of Search ................... 437/183, 189, 196

[56] References Cited

U.S. PATENT DOCUMENTS

| | | | |
|---|---|---|---|
| 3,028,663 | 4/1962 | Iwersen et al. | 29/195 |
| 3,200,490 | 8/1965 | Clymer | 357/67 |
| 3,434,828 | 3/1969 | Cornelison et al. | 75/165 |
| 3,686,698 | 8/1972 | Akeyama et al. | 317/234 |
| 4,403,397 | 9/1983 | Bottka et al. | 437/184 |

FOREIGN PATENT DOCUMENTS

| | | | |
|---|---|---|---|
| 2643147 | 4/1977 | Fed. Rep. of Germany . | |
| 2603745 | 8/1977 | Fed. Rep. of Germany . | |
| 0072351 | 5/1982 | Japan | 437/183 |
| 57-154844 | 9/1982 | Japan | 357/67 |
| 0073326 | 4/1986 | Japan | 437/183 |
| 0232625 | 10/1986 | Japan | 437/183 |

*Primary Examiner*—Olik Chaudhuri
*Attorney, Agent, or Firm*—Finnegan, Henderson, Farabow, Garrett, & Dunner

[57] ABSTRACT

A semiconductor device comprises a semiconductor substrate in which a plurality of semiconductor regions are formed, a front surface electrode in contact with the region, and a back surface electrode consisting of a gold alloy layer and a silver layer. After formation of the front surface electrode, the back side of the substrate is polished. Then, the gold alloy layer and the silver layer are formed in succession on the polished back surface of the substrate.

2 Claims, 4 Drawing Sheets

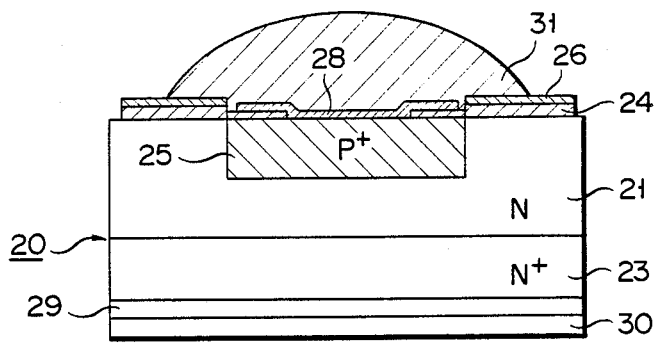
F I G. 6

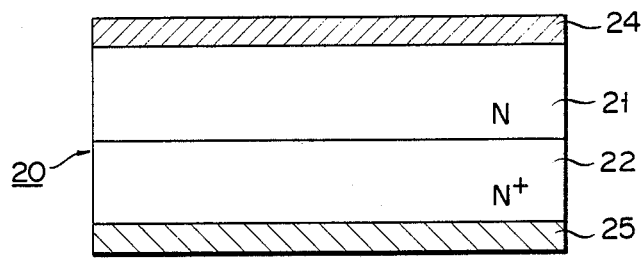
F I G. 7
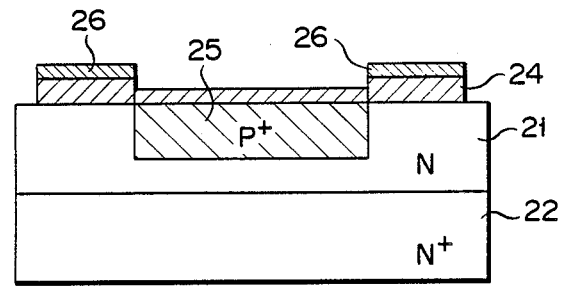
F I G. 8
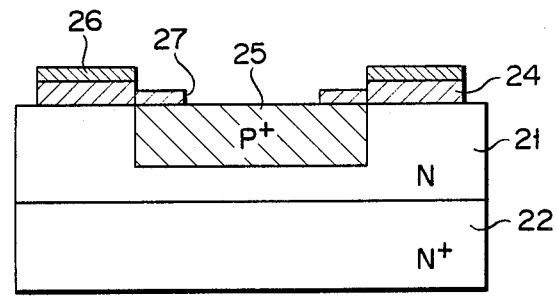
F I G. 9
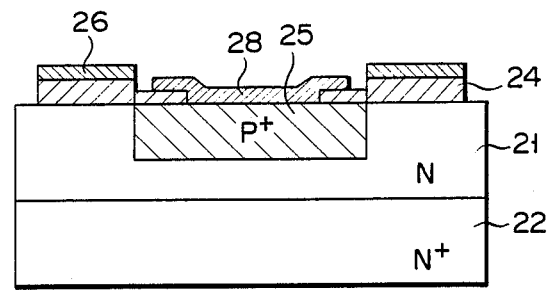
F I G. 10

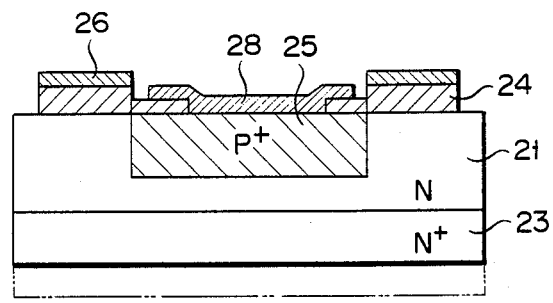
F I G. 11
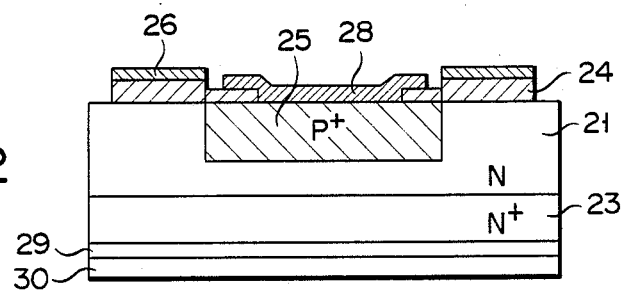
F I G. 12
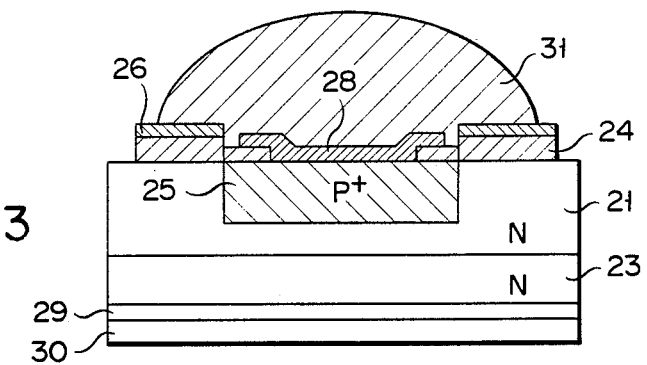
F I G. 13

METHOD OF PRODUCING A SEMICONDUCTOR DEVICE PROVIDED WITH FRONT AND BACK SURFACE ELECTRODES

This application is division, of application Ser. No. 610,703, filed May 16, 1984, now abandoned.

BACKGROUND OF THE INVENTION

The present invention relates to a semiconductor device, particularly, a device provided with two terminals, and a method of producing the same.

A glass sealed diode as shown in FIG. 1 is known as a semiconductor device provided with two terminals. It is seen that a semiconductor device 1, i.e., a diode, is housed in a glass container 2 which is held between jumets 3, 3. Lead wires 4, 4 are connected to the device 1 via the jumets 3, 3. A semiconductor device of this type comprises a semiconductor substrate provided with at least two semiconductor regions and front and back surface electrodes mounted on the front and back surfaces of the substrate. FIGS. 2-6 collectively show a method of producing a semiconductor device of this type.

In the first step, a semiconductor substrate 5 comprising an N+-region and an N-region formed on the N+-region is subjected to thermal oxidation to form insulation films 6 on both surfaces of the substrate. Then, an opening 7 is made in the insulation film 6 on the front surface of the substrate, i.e., on the N-region, followed by diffusing a P-type impurity through the opening 7 into the substrate to form a P+-region within the N-region, as shown in FIG. 2. Further, the insulation film on the back surface of the substrate 5 is removed by selective etching. As shown in FIG. 3, a thin insulation film 8 is formed on the insulation film 6 on the front surface and on the exposed substrate surface, followed by polishing the N+-region on the back side of the substrate 5 to a prescribed extent. The polishing is intended to control the depth of the N+-region. In some cases, the thickness of the substrate is reduced to nearly half the original thickness by the polishing treatment.

After the polishing treatment, a nickel layer is formed on the back surface of the substrate by an electroplating method, followed by sintering the nickel layer at about 700° C. for 10 minutes so as to form a sintered nickel layer 9 as shown in FIG. 4. FIG. 4 also shows a front surface electrode 10, which is formed by making a hole in the thin insulation layer 8 positioned on the P+-impurity region by selective etching, followed by vapor deposition of a gold alloy and subsequent selective etching of the gold alloy. Then, a silver bumper 11 is formed to cover the front surface electrode 10 as shown in FIG. 5. Further, a nickel layer 12, a gold layer 13, and a silver layer 14 are formed by an electroplating in the order mentioned on the sintered nickel layer 9 so as to form a back surface electrode.

In forming the silver bumper 11, the substrate is subjected to a pretreatment such as a water wash, followed by applying a silver plating to the substrate. An aqueous solution containing silver cyanide, potassium cyanide, potassium carbonate, potassium hydroxide, etc., is used as a plating bath. Naturally, the substrate and a silver plate immersed in the plating bath are connected to the negative and positive electrodes of a power source, respectively, so as to form a desired silver bumper on the front surface electrode.

It is important to note that, in the manufacturing process of the conventional semiconductor device, the nickel layer plated on the back surface of the substrate is subjected to a heat treatment in order to form the sintered nickel layer which permits to improvement on the bonding strength of the back surface electrode to the substrate. What should be noted is that the substrate tends to be cracked in the heat treating step. It should also be noted that the substrate thickness is reduced by the polishing applied to the back side of the substrate. As a result, the substrate tends to be easily cracked in the masking step employed several times after the polishing step for forming the front surface electrode as well as in the heating step mentioned above. An additional difficulty accompanying the prior art is that the debris generated in the polishing step is attached to the insulating film. It follows that pin holes are formed in the insulating film in the selective etching step, employed for forming the opening in preparation for the formation of the front surface electrode. Naturally, the resultant semiconductor device is rendered low in reliability.

SUMMARY OF THE INVENTION

An object of the present invention is to provide a highly reliable semiconductor device, particularly, a device provided with two terminals by eliminating the cracking or breakage of the substrate and pin hole occurrence.

To achieve this object, the back surface electrode is formed in the present invention without utilizing a sintered nickel layer. Also, in the method of the invention the substrate is polished after formation of the front surface electrode, followed by forming the back surface electrode.

According to the present invention, there is provided a semiconductor device, comprising:

a semiconductor substrate provided with a plurality of semiconductor regions and an insulation film formed on the front surface;

a front surface electrode connected to a prescribed semiconductor region via an opening made in the insulation film; and a back surface electrode consisting of a gold alloy layer formed on the back surface of the substrate, and a silver layer formed on the gold alloy layer.

The present invention also provides a method of producing a semiconductor device, comprising the steps of:

forming a front surface electrode connected to a prescribed semiconductor region of a semiconductor substrate, provided with a plurality of semiconductor regions, via an opening made in an insulation film formed on the substrate surface;

polishing the back surface side of the substrate to a prescribed extent;

forming a gold alloy layer providing a part of the back surface electrode on the polished back surface of the substrate; and forming a silver layer providing a part of the back surface electrode on the gold alloy layer.

BRIEF DESCRIPTION OF THE DRAWINGS

FIG. 6 is a cross sectional view showing a semiconductor device according to one embodiment of the present invention; and FIGS. 7–13 are cross sectional views collectively showing a method of producing the semiconductor device shown in FIG. 6.

DETAILED DESCRIPTION OF THE PREFERRED EMBODIMENT

Figure 1:
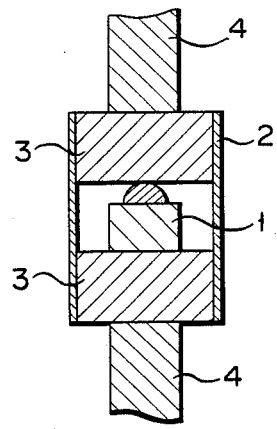
FIG. 1 is a cross sectional view schematically showing a conventional glass-sealed diode.
Figure 2:
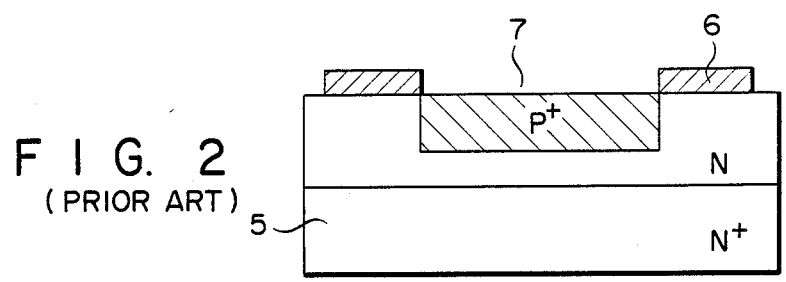
FIGS. 2-5 are cross sectional views collectively showing a conventional method of producing a semiconductor device.
Figure 3:
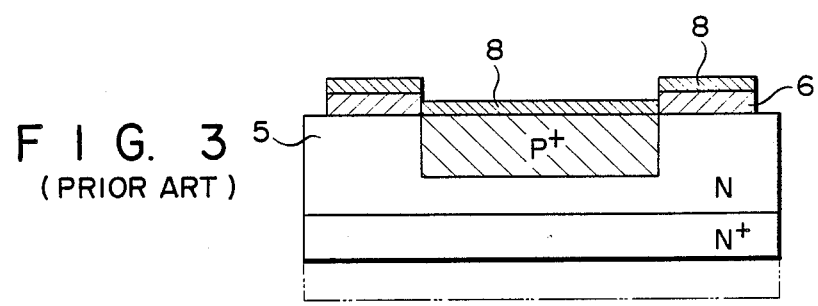
Figure 4:
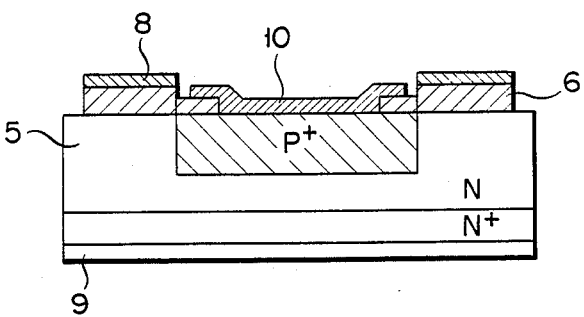
Figure 5:
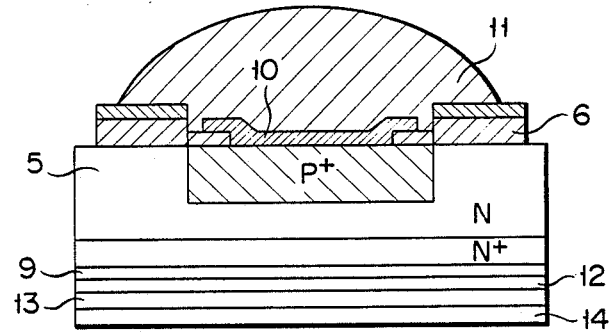

FIG. 6 shows a semiconductor device provided with two terminals according to one embodiment of the present invention. This embodiment is directed to a diode comprising an N-type semiconductor region 21 and an N+-type semiconductor region 23, both formed in a semicondutor substrate 20, and a P+-type semiconductor region 25 formed in the region 21. Of course, the present invention is not restricted to this embodiment. The conductivity type of each semiconductor region, the number of semiconductor regions, etc., may be properly determined as desired.

It is seen that an insulation film 24 consisting of, for example, silicon dioxide, is formed on the front surface of the substrate, i.e., on the surface of the N-type semiconductor region 21. The insulation film 24 is used as a mask in the step of forming the P+-type semiconductor region 25 by impurity diffusion. A thin insulation film 26 is further formed to cover the insulation film 24 and the exposed front surface of the substrate 20. A front surface electrode 28 is formed in contact with the P+-type semiconductor region 25 via an opening made in the thin insulation film 26. The front surface electrode 28, which consists of a gold alloy, e.g., an Au-Ga alloy, may be formed by, for example, a vapor deposition of the alloy and the subsequent selective etching of the deposited alloy layer. Further, a silver bumper 31 having a height of 40–60 μm is formed on the front surface electrode 28 by the method described previously.

On the other hand, a back surface electrode consisting of a gold alloy layer 29 and a silver layer 30 is formed on the back surface of the substrate 20, i.e., on the N+-type semiconductor region 23. The gold alloy layer 29, which consists of, for example, a Au-Ge or Au-Ge-Sb alloy, is preferably formed by a vapor deposition to have a thickness of 500–5000 Å, preferably, 1000–2000 Å. The gold alloy layer 29 formed in this fashion has high electrical conductivity and high adhesivity to the substrate 20, making it possible to eliminate a sintered nickel layer formed in the prior art by subjecting a nickel layer formed on the back surface of the substrate to a heat treatment. The silver layer 30 is formed on the gold alloy layer 29 to a thickness of 1.5–3.0 μm by, for example, a vapor deposition or plating method.

As described above, a back surface electrode of a simple structure consisting of a gold alloy layer and a silver layer is used in the semiconductor device of the present invention. The back surface electrode mentioned has high electrical conductivity and high adhesivity to the semiconductor substrate, making it possible to eliminate a sintered nickel layer used in the prior art. Since a sintered nickel layer is not used in the present invention, the substrate is neither cracked nor broken in the step of forming the back surface electrode, resulting in the high reliability of the produced semiconductor device.

FIGS. 7–13 collectively show how to produce the semiconductor device shown in FIG. 6. In the first step, insulation films 24, 25 are formed by thermal oxidation on the surfaces of a semiconductor substrate 20 comprising an N-type semiconductor region 21 and an N+-type semiconductor region 22, as shown in FIG. 7. Then, the insulation film 25 on the back surface of the substrate 20 is removed, while the insulation film 24 on the front surface is selectively removed by etching so as to provide an opening. A P-type impurity is diffused through the opening into the substrate to form a P+-type region 25 of a prescribed depth, followed by forming a thin insulation film 26 to cover the remaining insulation film 24 and the exposed surface of the P+-type region 25, as shown in FIG. 8.

In the present invention, a front surface electrode is formed before polishing the back side of the substrate 20. Specifically, the thin insulation film 26 on the front surface is patterned to provide an opening 27 as shown in FIG. 9, followed by forming a front surface electrode 28 connected to the P+-type region 25 as shown in FIG. 10. The front surface electrode 28 is formed by vapor deposition of a gold alloy, e.g., a Au-Ga alloy, followed by selective etching of the deposited alloy layer. Then, the back side of the substrate 20 is polished by the ordinary method so as to reduce the thickness of the N+-region 22 to a prescribed extent. As shown in FIG. 11, a thin N+-type region 23 results from the polishing treatment. For example, the substrate thickness is reduced from about 350 μm to about 180 μm by the polishing treatment.

Naturally, the substrate thinned by the polishing treatment has lower mechanical strength. In the present invention, however, a masking step, in which load is applied to the substrate, is not employed later because the front surface electrode is formed in advance. In addition, the substrate is not exposed to high temperatures as described previously. It follows that it is possible to substantially prevent the substrate from being cracked or broken in the manufacturing process of the semiconductor device. It should also be noted that the insulation films are selectively etched before the polishing step. Thus, the insulation films are free from pin holes caused by the debris accompanying the polishing step.

In the next step, a back surface electrode consisting of a gold alloy layer 29 having a thickness of, for example, 1000–2000 Å and a silver layer 30 having a thickness of 1.5–3.0 μm are formed by vapor deposition on the thin N+-type region 23, as shown in FIG. 12. The gold alloy layer 29 consists mainly of a Au-Ge alloy. Finally, a silver bumper 31 is formed on the front surface electrode 28 by the method described previously so as to produce a desired semiconductor device, shown in FIG. 13.

To reiterate, the polishing treatment of the back side of the substrate is performed in the present invention after formation of the front surface electrode. In addition, there is no sintered nickel layer, and thus, the heat treatment at temperatures of about 700° C., which is required in the prior art, need not be employed in the present invention. Further, the insulation film in direct contact with the semiconductor region is selectively etched to form the front surface electrode before the polishing treatment. These combine to produce a semiconductor device of high reliability at a high yield.

What is claimed is:

1. A method of producing a semiconductor device, comprising the steps of:
    forming a front surface electrode connected to a prescribed semiconductor region of a semiconductor substrate, provided with a plurality of semiconductor regions, via an opening made in an insulation film formed on the substrate surface;

polishing the back side of the substrate after said front surface electrode has been formed; and then forming a back surface electrode by forming a gold alloy layer on the polished back surface of the substrate and forming a silver layer on the gold alloy layer, said back surface electrode being formed without a heat treatment step, wherein the gold alloy layer is formed by vapor deposition of an alloy consisting essentially of Au-Ge alloy.

2. A method of producing a semiconductor device, comprising the steps of:

forming a front surface electrode connected to a prescribed semiconductor region of a semiconductor substrate, provided with a plurality of semiconductor regions, via an opening made in an insulation film formed on the substrate surface;

polishing the back side of the substrate after said front surface electrode has been formed; and then forming a back surface electrode by forming a gold alloy layer on the polished back surface of the substrate and forming a silver layer on the gold alloy layer, said back surface electrode being formed without a heat treatment step, wherein the gold alloy layer is formed by vapor deposition of an alloy consisting essentially of Au-Ge-Sb alloy.

* * * * *